(12) United States Patent
Chang

(10) Patent No.: US 9,543,160 B2
(45) Date of Patent: Jan. 10, 2017

(54) REDUCING DEFECTS IN PATTERNING PROCESSES

(71) Applicant: Taiwan Semiconductor Manufacturing Company, Ltd., Hsin-Chu (TW)

(72) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/830,087

(22) Filed: Aug. 19, 2015

(65) Prior Publication Data

US 2015/0357196 A1 Dec. 10, 2015

Related U.S. Application Data

(63) Continuation of application No. 14/206,501, filed on Mar. 12, 2014, now Pat. No. 9,123,662.

(60) Provisional application No. 61/778,201, filed on Mar. 12, 2013.

(51) Int. Cl.
| | |
|---|---|
| *H01L 21/311* | (2006.01) |
| *H01L 21/308* | (2006.01) |
| *H01L 21/3213* | (2006.01) |
| *H01L 21/027* | (2006.01) |
| *H01L 21/02* | (2006.01) |
| *H01L 21/033* | (2006.01) |

(52) U.S. Cl.
CPC ....... *H01L 21/3086* (2013.01); *H01L 21/0274* (2013.01); *H01L 21/02271* (2013.01); *H01L 21/0337* (2013.01); *H01L 21/3081* (2013.01); *H01L 21/3088* (2013.01); *H01L 21/31144* (2013.01); *H01L 21/32139* (2013.01)

(58) Field of Classification Search
CPC ............ H01L 21/0337; H01L 21/3086; H01L 21/0274; H01L 21/3088; H01L 21/31144; H01L 21/32139
USPC ........ 438/696, 947, 703, 736; 257/311, 313, 257/317, 323, E21.038, E21.039
See application file for complete search history.

(56) References Cited

U.S. PATENT DOCUMENTS

| | | | | |
|---|---|---|---|---|
| 6,365,529 B1 * | 4/2002 | Hussein | ............ | H01L 21/76808 257/E21.579 |
| 6,955,961 B1 | 10/2005 | Chung | | |
| 7,005,390 B2 * | 2/2006 | RamachandraRao | | H01L 21/76808 257/783 |
| 7,132,329 B1 * | 11/2006 | Hong | ..................... | B82Y 10/00 257/E21.209 |

(Continued)

*Primary Examiner* — Michael Trinh
(74) *Attorney, Agent, or Firm* — Slater Matsil, LLP

(57) ABSTRACT

A method includes forming a mask layer forming a first photo resist over the mask layer, performing a first patterning step on the first photo resist, and performing a first etching step on the mask layer using the first photo resist as an etching mask. The first photo resist is then removed. The method further includes forming a particle-fixing layer on a top surface and sidewalls of the mask layer, forming a second photo resist over the particle-fixing layer and the mask layer, performing a second patterning step on the second photo resist, and performing a second etching step on the particle-fixing layer and the mask layer using the second photo resist as an etching mask. The particle-fixing layer is etched through. A target layer underlying the mask layer is etched using the mask layer as an etching mask.

20 Claims, 4 Drawing Sheets

(56) References Cited

U.S. PATENT DOCUMENTS

| | | | |
|---|---|---|---|
| 7,183,195 B2* | 2/2007 | Lee | H01L 21/76808 |
| | | | 257/E21.579 |
| 8,106,519 B2* | 1/2012 | Hong | H01L 21/0337 |
| | | | 257/775 |
| 8,158,335 B2* | 4/2012 | Yeh | G03F 7/0035 |
| | | | 430/315 |
| 8,497,201 B2* | 7/2013 | Lee | H01L 21/0337 |
| | | | 257/E21.575 |
| 8,853,093 B2 | 10/2014 | Hu et al. | |
| 8,866,214 B2* | 10/2014 | Guo | H01L 29/4983 |
| | | | 257/328 |
| 9,123,662 B2* | 9/2015 | Chang | H01L 21/31144 |
| 2008/0045011 A1* | 2/2008 | Fuller | H01L 21/0332 |
| | | | 438/669 |
| 2011/0207329 A1* | 8/2011 | Shih | H01L 21/0332 |
| | | | 438/702 |
| 2012/0244694 A1* | 9/2012 | Shinohara | H01L 27/105 |
| | | | 438/591 |
| 2014/0024209 A1 | 1/2014 | Jung et al. | |

* cited by examiner

REDUCING DEFECTS IN PATTERNING PROCESSES

PRIORITY CLAIM AND CROSS-REFERENCE

This application is a continuation of U.S. patent application Ser. No. 14/206,501, entitled "Reducing Defects in Patterning Processes," filed Mar. 12, 2014, now U.S. Pat. No. 9,123,662 B2, which application claims the benefit of U.S. Provisional Application No. 61/778,201, filed Mar. 12, 2013, entitled, "Reducing Defects in Patterning Processes," which applications are hereby incorporated herein by reference.

BACKGROUND

Double patterning is a technology developed for enhancing feature density. In order to form the features of integrated circuits on wafers, lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, optical proximity effect posts an increasingly greater problem for the authentication of forming patterns from lithography mask to wafers. When two separate features are too close to each other, the optical proximity effect may cause the resulting formed features to short to each other. To solve such a problem, double-patterning technology is introduced. The closely located features are separated into two lithography masks, with both lithography masks used to expose the same photo resist and/or used to form patterns of a same layer. In each of the double patterning lithography masks, the distances between the features are increased over the distances between the features in the otherwise single patterning mask, and may be practically doubled when necessary. The distances in the double patterning lithography masks are greater than the threshold distances of the optical proximity effect, and hence the optical proximity effect is at least reduced, or substantially eliminated.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

The intermediate stages of a double-patterning process, which includes a two-patterning-two-etching (2P2E) process, is illustrated in accordance with an embodiment. The variations of the embodiments are discussed. Throughout the various views and illustrative embodiments, like reference numbers are used to designate like elements.

Figure 1:
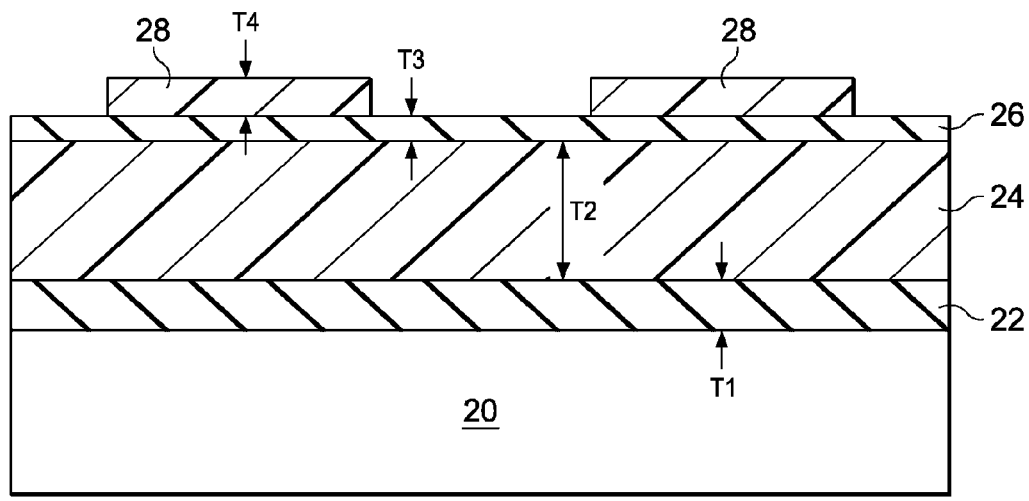
FIGS. 1 through 10 are cross-sectional views of intermediate stages in a two-patterning-two-etching (2P2E) process in accordance with some exemplary embodiments.

Referring to FIG. 1, an initial structure is provided. The initial structure may be an intermediate structure of an integrated circuit manufacturing process. The initial structure includes layer 20, which is the target layer that is to be patterned in subsequent processes. In some embodiments, layer 20 is a semiconductor substrate, which may be formed of a semiconductor material such as silicon, silicon germanium, silicon carbon, a III-V compound semiconductor, or the like, and may be a bulk substrate or a Semiconductor-On-Insulator (SOI) substrate. In other embodiments, layer 20 includes a metal layer, which may include copper, aluminum, tungsten, nickel, titanium, tantalum, multi-layers thereof, and/or alloys thereof. In yet other embodiments, layer 20 is a dielectric layer, which may include an oxide, a nitride, an oxynitride, multi-layers thereof, and/or combinations thereof. The initial structure may include more layers underlying layer 20, which layers are not shown herein.

Mask layer 22 is formed over layer 20, and is referred to as hard mask layer 22 hereinafter. In some embodiments, hard mask layer 22 comprises a nitride such as silicon nitride, an oxide such as silicon oxide, an oxynitride such as silicon oxynitride, or the like. Thickness T1 of hard mask layer 22 may be between about 20 Å and about 2,000 Å. It is appreciated, however, that the values recited throughout the description are merely examples, and may be changed to different values.

In accordance with some embodiments, a tri-layer is formed over layer 20, which tri-layer includes under layer 24, middle layer 26 over middle layer 26, and upper layer 28 over middle layer 26. The patterning of the tri-layer is referred to as the first patterning process in the 2P2E. In some embodiments, under layer 24 and upper layer 28 are formed of photo resists, which are organic materials. Under layer 24 may have thickness T2 between, for example, about 1,000 Å and about 2,000 Å. Middle layer 26 may comprise an inorganic material, which may be a nitride (such as silicon nitride), an oxynitride (such as silicon oxynitride), an oxide (such as silicon oxide), or the like. Middle layer 26 may have thickness T3 between, for example, about 300 Å and about 400 Å. Upper layer 28 may have thickness T4 between, for example, about 500 Å and about 700 Å. Middle layer 26 has a high etching selectivity with relative to upper layer 28 and under layer 24, and hence upper layer 28 may be used as an etching mask for the patterning of middle layer 26, and middle layer 26 may be used as an etching mask for the patterning of under layer 24. After the application of upper layer 28, upper layer 28 is patterned.

Next, middle layer 26 is etched using the patterned upper layer 28 as an etching mask, so that the pattern of upper layer 28 is transferred to middle layer 26. During the patterning of middle layer 26, upper layer 28 is at least partially, or entirely, consumed. After middle layer 26 is etched through, under layer 24 is patterned, wherein middle layer 26 is used as an etching mask. Upper layer 28 will also be fully consumed during the patterning of under layer 24 if it has not been fully consumed in the patterning of middle layer 26.

Figure 2:
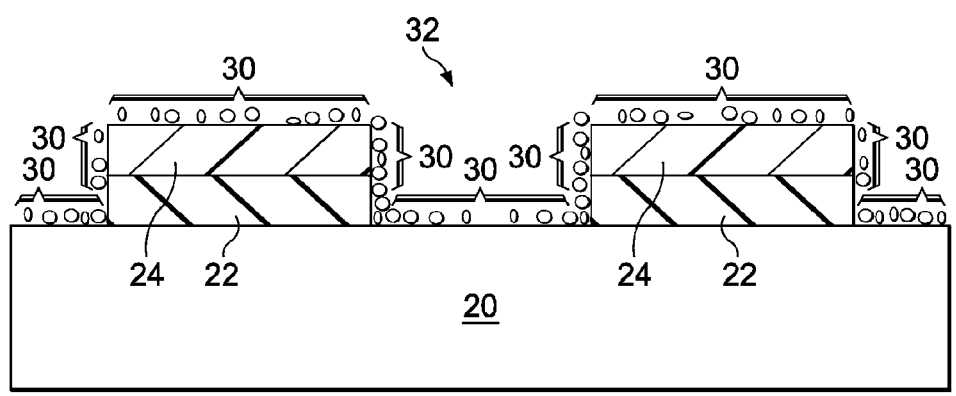

After the patterning of under layer 24, under layer 24 and the overlying middle layer 26 are used as an etching mask to etch the underlying hard mask layer 22, which etching process is referred to as the first etching process. The resulting structure is shown in FIG. 2. Since middle layer 26 and hard mask layer 22 are both formed of inorganic materials, and may have a low etching selectivity with relative to each other, middle layer 26 is quickly consumed, and under layer 24 acts as the etching mask in the subsequent etching of hard mask layer 22. During the patterning of hard mask layer 22, under layer 24 is also consumed, although at a lower etching rate than middle layer 26 and hard mask layer 22. Hence, at a time the patterning of hard mask layer 22 is finished, the thickness of under layer 24 is reduced, as shown in FIG. 2.

Since hard mask layer 22 and/or middle layer 26 comprise some inorganic materials such as silicon, inorganic-containing particles 30 may be generated in the patterning of layers 26, 24, and 22. Inorganic-containing particles 30 may be left on the surfaces and sidewalls of the remaining structures, including the top surfaces of under layer 24 and the sidewalls of under layer 24 and hard mask layer 22. In addition, during the patterning of hard mask layer 22 (and/or the patterning of middle layer 26), some polymer-generating chemicals may be used in order to reduce the width of the resulting opening 32, which is the opening between the remaining portions of hard mask layer 22. For example, $C_2F_6$ may be used in the patterning of hard mask layer 22, wherein $C_2F_6$ may result in the generation of a polymer on the sidewalls of hard mask layer 22, so that the lateral etching of hard mask layer 22 is reduced. The polymer, however, may also result in the generation of inorganic-containing particles 30, which comprise the polymer and the inorganic materials.

Figure 3:
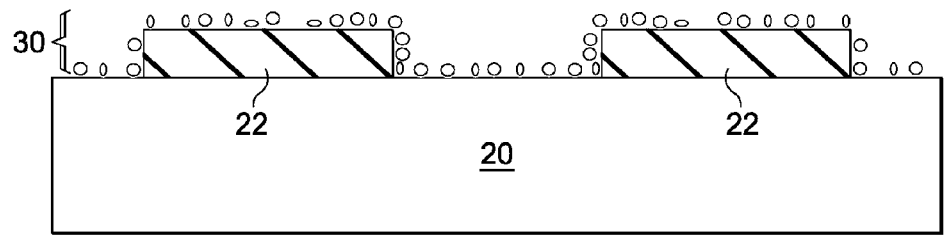

Under layer 24 is then stripped, result in the structure in FIG. 3. In some embodiments, the stripping of under layer 24 is performed using a chemical comprising hydrogen peroxide ($H_2O_2$), sulfuric acid ($H_2SO_4$), oxygen ($O_2$), ozone ($O_3$), or the like. The chemical for removing under layer 24 is ineffective in removing inorganic-containing particles 30. Hence, after the stripping of under layer 24, at least some inorganic-containing particles 30 remain on the top surface and sidewalls of hard mask layer 22.

Figure 4:
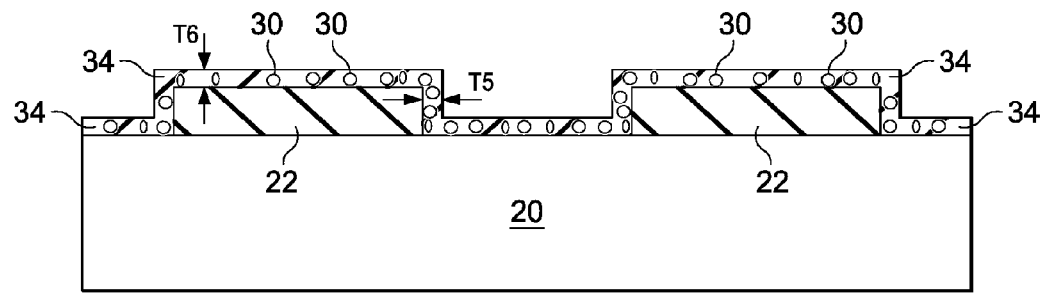
Figure 5:
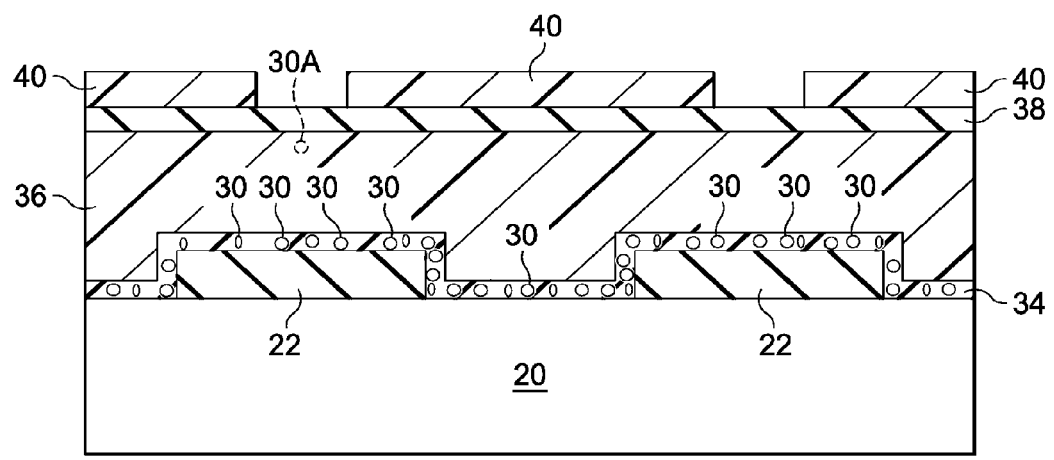

Referring to FIG. 4, conformal layer 34 is deposited on the top surfaces and the sidewalls of hard mask layer 22, and on the exposed surfaces of target layer 20. Conformal layer 34 has the function of fixing inorganic-containing particles 30 in place, so that inorganic-containing particles 30 do not migrate into the subsequently formed under layer 36 (FIG. 5). Hence, conformal layer 34 is also referred to as particle-fixing layer 34 hereinafter. In some embodiments, conformal layer 34 is formed using a Chemical Vapor Deposition (CVD) method such as Low temperature CVD, high temperature CVD, Plasma Enhancement CVD (PECVD), or the like. Conformal layer 34 includes vertical portions on the sidewalls of hard mask layer 22, wherein the vertical portions have thickness T5. Conformal layer 34 also includes horizontal portions over and contacting hard mask layer 22 and target layer 20. Ratio T5/T6 may be greater than about 0.1, and may be between about 0.8 and 1.0. In some embodiments, thicknesses T5 and T6 are between about 1 Å and about 100 Å, and may be between about 10 Å and about 20 Å. Conformal layer 34 may comprise an inorganic material such as silicon, an oxide such as silicon oxide, a nitride such as silicon nitride, a cross-linked polymer, amorphous carbon, and/or the like.

FIG. 5 illustrates the formation of a second tri-layer, which includes under layer 36, middle layer 38, and upper layer 40. The patterning of the second tri-layer is referred to as the second patterning process in the 2P2E. The materials of under layer 36, middle layer 38, and upper layer 40 may be selected from the same groups of candidate materials of under layer 24, middle layer 26, and upper layer 28, respectively. Conformal layer 34 is not dissolvable in the solvent of under layer 36, and hence remains to be an integrated layer after the formation of under layer 36. Inorganic-containing particles 30 are hence fixed in their positions, and do not migrate into under layer 36.

Figure 6:
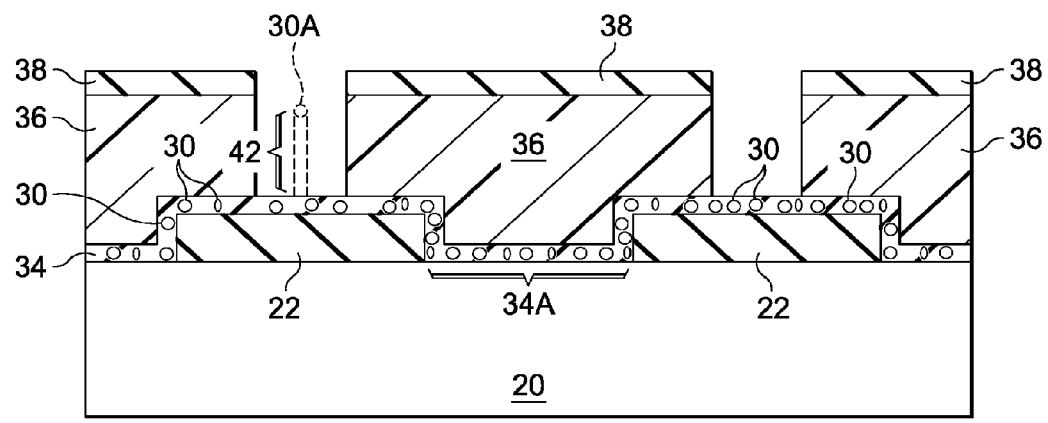

Middle layer 38 and under layer 40 are then patterned using upper layer 40 as an etching mask. The resulting structure is shown in FIG. 6. After the patterning, conformal layer 34 is exposed. Since conformal layer 34 fixes inorganic-containing particles 30 in place, the number of defects in the structure shown in FIG. 6 is significantly reduced. The reasons are briefly explained as follows. Referring to FIG. 5, if conformal layer 34 is not formed, inorganic-containing particles 30 are not fixed, and some of inorganic-containing particles 30 may migrate into under layer 36. FIGS. 5 and 6 illustrate inorganic-containing particle 30A that would migrate into under layer 36 when conformal layer 34 is not formed. In the patterning of under layer 36, since inorganic-containing particle 30A contains inorganic material, and under layer 36 is organic, inorganic-containing particle 30A is not easily etched by the etchant used for etching under layer 36. Inorganic-containing particle 30A hence remains after the etching of under layer 36. Furthermore, the portion of under layer 36 overlapped by inorganic-containing particle 30A is also protected by inorganic-containing particle 30A from being etched. Hence, defect 42 is generated, wherein defect 42 includes inorganic-containing particle 30A and the underlying portion of under layer 36 that should have been etched. Defect 42 may cause the underlying portion of hard mask layer 22 fail to be etched in the subsequent steps.

In the embodiments of the present disclosure, the formation of conformal layer 34 substantially eliminates, or at least reduces, the number of inorganic-containing particles 30 that migrate into under layer 36, and hence the number of defect 42 is substantially eliminated, or at least reduced.

Figure 7:
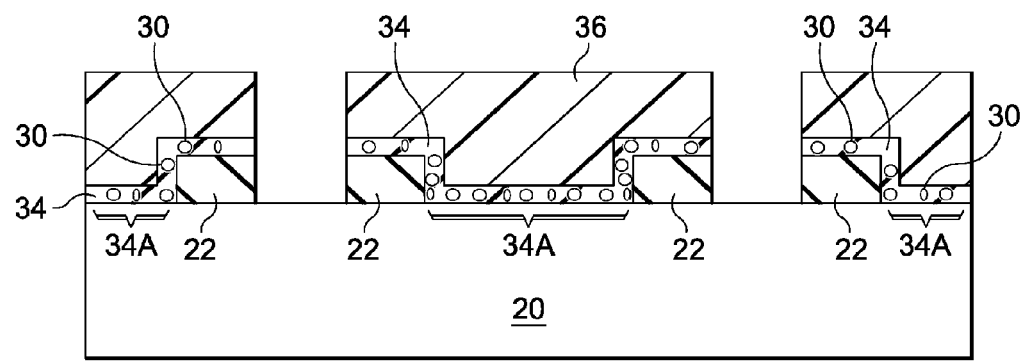

Referring to FIG. 7, conformal layer 34 and hard mask layer 22 are etched using under layer 36 as an etching mask. The etching of hard mask layer 22 is referred to as the second etching process in the 2P2E. Conformal layer 34 includes horizontal portion 34A over and contacting the top surface of target layer 20. Portion 34A is not patterned in the second etching process. In the second etching step, conformal layer 34 and under layer 36 have an etching selectivity higher than about 0.5, wherein the etching selectivity is the etching rate of conformal layer 34 to the etching rate of under layer 36. Middle layer 38 is removed in the etching. Inorganic-containing particles 30 are also etched. Hence, the second etching of hard mask layer 22 is finished, and hard mask layer 22 comprises the patterns resulted from the first patterning and the first etching (FIGS. 1 through 4) and second patterning and the second etching (FIGS. 5 through 7).

Figure 8:
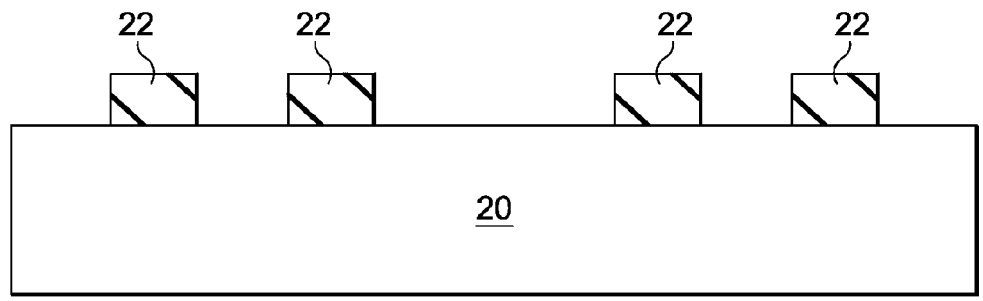
Figure 9:
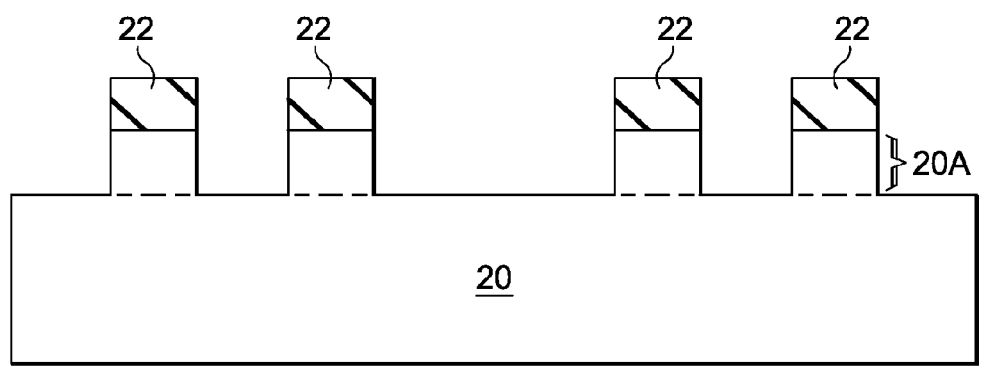
Figure 10:
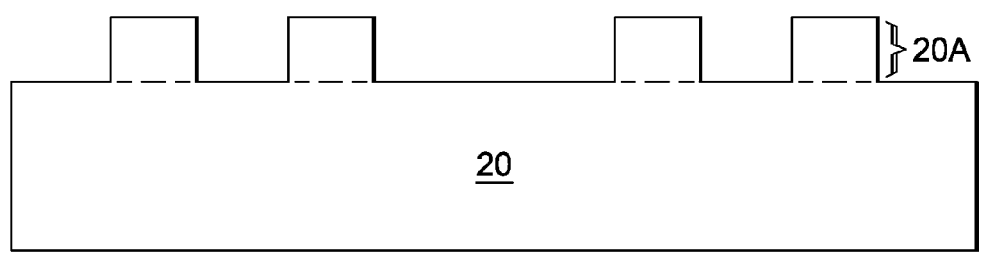

Next, as shown in FIG. 8, under layer 36 is stripped, for example, using the same method and same chemical for stripping under layer 24 (FIG. 3). In addition, the remaining portions of conformal layer 34 are removed, for example, in an additional etching step that uses a chemical attacking conformal layer 34 and inorganic-containing particles 30. The pattern of hard mask layer 22 may then be transferred to the underlying layer 20 through the etching of underlying layer 20. FIG. 9 illustrates an exemplary resulting structure. In some embodiments, for example, when target layer 20 is a substrate, a top layer 20A of layer 20 is etched using hard mask layer 22 as the etching mask. The final structure is shown in FIG. 10. In alternative embodiments, target layer 20 may be etched through.

In the embodiments of the present disclosure, a conformal layer is formed to hold the inorganic-containing particles from migrating, which inorganic-containing particles are generated in a first-patterning-first-etching process. Hence, the inorganic-containing particles do not migrate into the under layer of the second-patterning-second-etching process. The number of defects is hence reduced. Experimental results indicate that by adopting the process of the present disclosure, the defects in the two-patterning-two-etching (2P2E) are reduced by a half.

In accordance with some embodiments, a method includes forming a mask layer forming a first photo resist over the mask layer, performing a first patterning step on the first photo resist, and performing a first etching step on the mask layer using the first photo resist as an etching mask. The first photo resist is then removed. The method further includes forming a particle-fixing layer on a top surface and sidewalls of the mask layer, forming a second photo resist over the particle-fixing layer and the mask layer, performing a second patterning step on the second photo resist, and performing a second etching step on the particle-fixing layer and the mask layer using the second photo resist as an etching mask. The particle-fixing layer is etched through. A target layer underlying the mask layer is etched using the mask layer as an etching mask.

In accordance with other embodiments, a method includes forming a mask layer over a target layer, performing a first etching step to pattern the mask layer, wherein remaining portions of the mask layer form a first patterned mask layer, and forming a conformal layer on a top surface and sidewalls of the first patterned mask layer. A patterning step is performed to pattern the conformal layer and the first patterned mask layer using a same etching mask, wherein remaining portions of the first patterned mask layer form a second patterned mask layer. Remaining portions of the conformal layer are then removed. The target layer is etched using the second patterned mask layer as an etching mask. The second patterned mask layer is then removed.

In accordance with yet other embodiments, a method includes forming a mask layer over a target layer, and forming a first stacked layer over the mask layer. The first stacked layer includes a first under layer over the mask layer, and a first middle layer over the first under layer. The first middle layer comprises an inorganic material. The method further includes patterning the first stacked layer to form a first patterned stack, performing a first etching on the mask layer using the first patterned stack as an etching mask, removing remaining portions of the first patterned stack, forming a conformal layer on a top surface and sidewalls of the mask layer and on exposed surfaces of the target layer, and forming a second stacked layer over the mask layer. The second stacked layer includes a second under layer over the mask layer, and a second middle layer over the second under layer. The second stacked layer is patterned to form a second patterned stack. The conformal layer and the mask layer are etched using the second patterned stack as an etching mask. The target layer is then using the mask layer as an etching mask.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a mask layer over an underlying layer;
    forming a first patterned photo resist over the mask layer;
    performing a first etching step on the mask layer using the first patterned photo resist as an etching mask, thereby forming a first etched mask layer;
    removing the first patterned photo resist;
    forming a particle-fixing layer contacting the first etched mask layer, wherein the particle-fixing layer fills a lower portion of a gap between two neighboring remaining portions of the first etched mask layer, wherein an upper portion of the gap is unfilled by the particle-fixing layer;
    forming a second patterned photo resist over the particle-fixing layer and the first etched mask layer;
    performing a second etching step on the particle-fixing layer and the mask layer using the second patterned photo resist as an etching mask, thereby forming a second etched mask layer;
    patterning the underlying layer using the second etched mask layer as a mask; and
    removing the second etched mask layer.

2. The method of claim 1, wherein the particle-fixing layer is a conformal layer comprising a horizontal portion overlapping the first etched mask layer, and a vertical portion on a sidewall of the mask layer.

3. The method of claim 1 further comprising:
    forming a first middle layer over the first patterned photo resist, wherein the first middle layer comprises an inorganic material;
    forming a first upper layer over the first middle layer and patterning the first upper layer, wherein the first upper layer comprises a photo resist; and
    before the first etching step, patterning the first middle layer using the first upper layer as a patterning mask, wherein the first patterned photo resist is patterned using the first middle layer as an etching mask.

4. The method of claim 1 further comprising:
    forming a second middle layer over the second patterned photo resist, wherein the second middle layer comprises an inorganic material;
    forming and patterning a second upper layer over the second middle layer, wherein the second upper layer comprises a photo resist; and
    patterning the second middle layer using the second upper layer as a patterning mask, wherein the second patterned photo resist is patterned using the second middle layer as an etching mask.

5. The method of claim 1, wherein the first etching step comprises using a polymer-generating chemical.

6. The method of claim 1, wherein the first etching step comprises using $C_2F_6$.

7. The method of claim 1, wherein the particle-fixing layer comprises a cross-linked polymer layer.

8. A method comprising:
forming a mask layer over a target layer;
forming a first patterned mask layer over the mask layer;
performing a first etching step to pattern the mask layer using the first patterned mask layer as a mask, wherein remaining portions of the mask layer form second patterned mask layer, inorganic-containing particles from the mask layer and the first patterned mask layer remaining on the second patterned mask layer after the first etching step;
removing the first patterned mask layer;
forming a particle-fixing layer contacting a top surface and sidewalls of the second patterned mask layer;
performing a patterning step to pattern the particle-fixing layer and the second patterned mask layer using a same etching mask, wherein remaining portions of the second patterned mask layer form a third patterned mask layer;
etching the target layer using the third patterned mask layer as an etching mask; and
removing the third patterned mask layer.

9. The method of claim 8, wherein the particle-fixing layer comprises horizontal portions located in spaces between discrete portions of the second patterned mask layer, and wherein in the patterning step, the horizontal portions are not patterned.

10. The method of claim 8, wherein a bottom surface of the second patterned mask layer is in contact with a top surface of the target layer, and wherein the particle-fixing layer is in physical contact with the top surface and the sidewalls of the second patterned mask layer.

11. The method of claim 8, wherein in the patterning step, the particle-fixing layer and the second patterned mask layer are patterned using a same etching mask.

12. The method of claim 11, wherein the same etching mask comprises a photo resist.

13. A method comprising:
forming a mask layer over and contacting a target layer, wherein an entirety of the mask layer is a single layer;
forming a first stacked layer over and contacting the mask layer, wherein the first stacked layer comprises:
a first under layer over the mask layer; and
a first middle layer over the first under layer, wherein the first middle layer comprises an inorganic material;
patterning the first stacked layer to form a first patterned stack;
performing a first etching on the mask layer using the first patterned stack as an etching mask;
removing the first patterned stack;
forming a particle-fixing layer physically contacting sidewalls of the mask layer, wherein the particle-fixing layer fills a lower portion of a gap between two neighboring remaining portions of the mask layer, wherein an upper portion of the gap is unfilled by the particle-fixing layer;
forming a second stacked layer over the mask layer, wherein the second stacked layer comprises:
a second under layer over the mask layer; and
a second middle layer over the second under layer;
patterning the second stacked layer to form a second patterned stack;
etching the particle-fixing layer and the mask layer using the second patterned stack as an etching mask;
after etching the particle-fixing layer and the etched mask layer, etching the target layer using the etched mask layer as a mask; and
removing the mask layer.

14. The method of claim 13, wherein the particle-fixing layer is configured to be un-dissolvable in solvents of the second under layer.

15. The method of claim 13, wherein the particle-fixing layer comprises a material selected from amorphous carbon, a nitride, an oxynitride, an oxide, and combinations thereof.

16. The method of claim 13, wherein the particle-fixing layer comprises a cross-linked polymer.

17. The method of claim 13 further comprising, before the step of etching the target layer, removing remaining portions of the particle-fixing layer.

18. The method of claim 8, wherein the particle-fixing layer fills a lower portion of a gap between two neighboring remaining portions of the mask layer, wherein an upper portion of the gap is unfilled by the particle-fixing layer.

19. The method of claim 13, wherein performing the first etching comprises generating a polymer.

20. The method of claim 13, wherein a ratio of a thickness of the particle-fixing layer along the sidewalls of the mask layer to a thickness of the particle-fixing layer on a top surface of the mask layer is between 0.8 and 1.0.

* * * * *